(12) United States Patent
Kung

(10) Patent No.: US 7,049,822 B2
(45) Date of Patent: May 23, 2006

(54) COMBINATION BATTERY, LIGHT BULB, AND FUSE TESTER

(75) Inventor: Chi Hung Kung, Kowloon (HK)

(73) Assignee: HSN Improvements, LLC, Weehawken, NJ (US)

( * ) Notice: Subject to any disclaimer, the term of this patent is extended or adjusted under 35 U.S.C. 154(b) by 0 days.

(21) Appl. No.: 10/284,755

(22) Filed: Oct. 31, 2002

(65) Prior Publication Data

US 2004/0160225 A1 Aug. 19, 2004

(51) Int. Cl.
*G01N 27/416* (2006.01)

(52) U.S. Cl. .................................. 324/437; 324/426

(58) Field of Classification Search ................ 324/437, 324/426, 439; 320/139, 137
See application file for complete search history.

(56) References Cited

U.S. PATENT DOCUMENTS

| 2,663,845 | A | | 12/1953 | Koch ........................... 324/127 |
| 3,949,517 | A | | 4/1976 | Reiner et al. .................. 446/26 |
| 4,514,695 | A | * | 4/1985 | Lau ............................. 324/437 |
| 4,529,389 | A | | 7/1985 | Kennedy et al. .............. 446/26 |
| 4,659,994 | A | | 4/1987 | Poljak |
| D297,516 | S | | 9/1988 | Wang ........................... D10/77 |
| 4,820,229 | A | | 4/1989 | Spraggins ..................... 446/26 |
| 5,087,885 | A | | 2/1992 | Bergstrom |
| 5,254,952 | A | * | 10/1993 | Salley et al. ................. 324/429 |
| 5,376,887 | A | | 12/1994 | Saubolle |
| 5,404,105 | A | * | 4/1995 | Chari ........................... 324/426 |
| 5,862,515 | A | | 1/1999 | Kobayashi et al. ........... 702/63 |
| 5,909,100 | A | * | 6/1999 | Watanabe et al. ........... 320/108 |
| 5,914,605 | A | | 6/1999 | Bertness |
| 6,126,373 | A | | 10/2000 | Yee et al. ...................... 414/5 |
| 6,128,004 | A | | 10/2000 | McDowall et al. .......... 345/158 |
| D442,503 | S | | 5/2001 | Lundbeck et al. |
| 6,323,650 | B1 | * | 11/2001 | Bertness et al. ............. 324/426 |
| 6,456,045 | B1 | | 9/2002 | Troy et al. |
| 2003/0001578 | A1 | * | 1/2003 | Lam ............................ 324/426 |

FOREIGN PATENT DOCUMENTS

| DE | 3004734 | 8/1981 |
| DE | 3530148 | 2/1987 |
| FR | 2575837 | 7/1986 |
| SU | 706745 | 12/1979 |

OTHER PUBLICATIONS

Web page by Auto Meter Test Equipment advertising "Multimeter Pocket Testers AC/DC Inductive Amp Probes" (date of first publication unknown). Applicant admits the status of this publication as prior art for the limited purpose of examination of this application, but otherwise reserves the right to challenge the status of this publication as prior art.

Web page by Amprobe Instrument advertising "Model: AM–1200 Multimeter Digital" (date of first publication unknown). Applicant admits the status of this publication as prior art for the limited purpose of examination of this application, but otherwise reserves the right to challenge the status of this publication as prior art.

(Continued)

*Primary Examiner*—Anjan Deb
*Assistant Examiner*—Amy He
(74) *Attorney, Agent, or Firm*—Thompson Hine LLP

(57) ABSTRACT

A combination battery, light bulb, fuse tester having novel features. In particular, the tester includes a novel probe apparatus including an actuator, a pair of opposed probe arms, each of the probe arms having an electrical contact on an end thereof, the probe arms being adapted such that operation of the actuator biases the ends of the probe arms away from each other to an open position allowing the electrical poles of a battery, light bulb, or fuse to be tested to be contacted by the contacts on the probe arms. Additional features include magnetic probe contacts to facilitate the testing of a battery, light bulb, or fuse.

52 Claims, 6 Drawing Sheets

OTHER PUBLICATIONS

"Operating Instructions for Amprobe® Model AM–1200 Digital Industrial Multimeter," by Amprobe Instrument (Apr. 1992).

Web page by Amprobe Instrument advertising "Model: RS–3 Super Rotary Scale Clamp–on Multimeter" (date of first publication unknown). Applicant admits the status of this publication as prior art for the limited purpose of examination of this application, but otherwise reserves the right to challenge the status of this publication as prior art.

"Operating Instructions Amprobe® Rotary Scale Clamp–on Model RS–3 Super," by Amprobe Instrument (Jun. 1995).

Web page news article by Industrial News Room regarding "ClampOn Meter measures current and voltage," by Fluke Corp. (Nov. 2001.

Web page news article by Industrial News Room regarding "Power Clamp Meter troubleshoots electrical systems," by B & K Precision Corp. (Apr. 2004).

"User's Manual Models 300 3/031 Leakage Clamp–on Tester," by Yokogawa M&C Corporation (Feb. 1999).

Product information literature for "Battery, Bulb, & Fuse Tester," by Improvements (Sep. 2002).

On–line "Hearing Aid Accessories Catalog," by AudioExtras, Inc. (Oct. 2002).

On–line catalog for "Battery/Alternator Tester 12/24V LED," by Justoffbase Tools (Oct. 2002).

Catalog, "Just ONE Tester Tests All Your Batteries, Bulbs & Fuses!", by Improvements (Sep. 2002).

Catalog, "Simple Storage For All Those Batteries . . . Even Includes a Built–In Tester!", by Improvements (Sep. 2002).

Catalog, "One Tester Examines All The Electricity In Your Home, Your Car, Your Batteries!", by Imrpovements (Sep. 2002).

On–line catalog for testers by ZTS Products (Jul. 2002).

On–line catalog for "Multi Battery Tester," by Herrington (Aug. 2001).

* cited by examiner

COMBINATION BATTERY, LIGHT BULB, AND FUSE TESTER

BACKGROUND OF THE INVENTION

The present invention relates to a device and method for testing batteries, light bulbs, and fuses. More specifically, the invention relates to a device and method for testing batteries, light bulbs and fuses which provides accurate, easy-to-read results as to the condition of the item being tested, which is relatively simple to use, and which is ergonomic in design and operation.

In particular, this invention relates to battery testers as commonly used for testing dry cell batteries. The term battery may be used collectively in the present context to include reference to single as well as multiple cells. The widespread use of batteries in consumer appliances, such as portable AM/FM radios, CD players, MP3 players, watches, calculators, hearing aids, PDA's, toys, games, etc., has given rise to a significant demand for devices for testing them. Furthermore, it is noted that some of the batteries that need to be tested, such as the small "button" cells which are increasingly being used for powering more and more electronic devices, can pose particular problems, given their small size, for the elderly to manipulate. This can be particularly distressing given that these batteries are of the type that are generally used in hearing aids.

In addition, many bulbs and fuses are likewise used in everyday household and automotive applications. Just as it is not possible to determine the condition of a battery by looking at it, it is likewise impossible (in many cases) to determine the condition of a bulb or fuse merely by looking at it. Small bulbs, such as those used in Christmas light strings, are often colored and use small filaments, so it is not easy to know if the filament is broken or burned out by observation. As another example, it is difficult to determine if a small Halogen "pin" bulb is burned out or not because the filaments inside these bulbs are typically difficult to observe through the relatively thick glass of the bulb. In addition, some small automotive fuses are hard to "read" by observation. These examples underscore the need for a simple bulb and fuse tester.

With respect to the testing of a bulb or fuse, it is noted that both of these devices are essentially "closed circuit" devices. A bulb has a very thin wire called a filament inside a protective glass shell. The filament gets very hot when current is passed through it. When it gets hot, it glows to produce visible light. When the filament burns out or is broken, then of course current cannot pass through the filament and therefore it will not produce light. A fuse works in a similar manner, but with the difference that the wire inside a fuse is relatively large or thick and is sized to carry a certain amount of high current before it melts and opens the circuit, interrupting the flow of current. A fuse is not intended to glow and produce light. Instead, the material used in a fuse is designed to melt when the current flowing in a circuit surpasses the design limit of the fuse wire, at which time it interrupts the current flow and causes an open circuit. The fuse thus sacrifices itself to protect other more sensitive and expensive components in the circuit, including the circuit wiring.

To test a bulb or fuse, therefore, a circuit is necessary which is able to test the "continuity" of the device. To do so, the circuit must have a source of current. Therefore, a "continuity" tester is normally designed to use an internal voltage source, usually some sort of battery, that may be used to cause a small current to flow through the bulb or fuse when it is placed in the test circuit. In addition to the battery, a galvanometer movement (a small meter with a pointer that is deflected when current flows through the meter) is also normally used in the test circuit to measure the amount of current passing through the bulb or fuse. If the bulb or fuse is acceptable for use, then the current passing through the bulb or fuse causes the galvanometer to deflect (or light up a light on the meter) to represent this fact. A Light Emitting Diode (LED) can be used as the light in such circumstance to indicate the "good" or "bad" status of the bulb or fuse if desired.

As mentioned above, it is also frequently desired to have a tester which accurately tests the condition of a battery. Such accurate testing can generally not be accomplished using a simple open circuit-type terminal voltage tester, instead requiring a load-based tester. Load-based testers are considered an improvement over less-expensive open circuit testers in that load-based testers are designed to measure the closed circuit battery terminal voltage under a load. In contrast, most inexpensive open circuit battery testers merely measure the open circuit battery terminal voltage with no load. And while such testers do not generally require the use of a complicated electronic circuit, integrated circuit (IC), or a microprocessor, thereby making them relatively inexpensive to design and make, the results obtained using such testers are not nearly as accurate or consistent as the results obtained using a load-based battery tester.

More specifically, open circuit-type testers are relatively limited in value because they do not test a battery under a realistic "load" condition. Under a load, the terminal voltage of a battery will decrease to a much greater extent than if no load is applied. The state of the battery terminal voltage under load will provide a much more meaningful measure of how much useful life is remaining in a battery. However, as noted above, load testers, because they must apply a given load that is dependent on the properties of the battery being tested, normally require more sophisticated electronic circuits than open circuit testers.

In practice, a load-based battery tester places a resistive load across the terminals of the battery to be tested and then measures the drop in terminal voltage as a result of the applied load. The remaining life of the battery is then a measure of the relative drop in terminal voltage under the applied load (closed circuit voltage). The results are calculated on the basis that every battery has a milliampere hour (mAh) rating from the manufacturer. A fully charged battery exhibits a maximum terminal voltage and a maximum mAh capacity. As the battery is used and becomes discharged, the terminal voltage begins to drop. At some point, called the cutoff voltage, the battery can no longer provide sufficient electrical energy to power an electronic device. Thus, the remaining useful life of a battery can be determined by measuring the terminal voltage under a given load. This voltage will begin at a maximum voltage (fully charged) and end at the cutoff voltage where the battery is "dead" or fully discharged. At closed circuit voltages in between these extremes, the percent of battery life remaining can be scaled and appropriately indicated by a meter or lights.

More specifically, the circuit in a load tester may be designed to cause a meter to deflect a given amount or cause small Light Emitting Diodes (LEDs) to illuminate at certain voltage thresholds designed into the circuit. If there is virtually no voltage drop under a test load, the battery should read as "good". If the battery drops to the cutoff voltage specified by the battery manufacturer, then the tester should indicate that the battery is "bad" and should be changed. Thresholds in between these extremes can be calibrated to show various levels of remaining battery life.

In addition to testing battery life, as noted above, it is also sometimes desired to have a testing device that is capable of testing the general condition of light bulbs and/or fuses.

Accordingly, there is a need for compact, economical testers capable of simply and easily testing a range of batteries varying size and/or voltages, light bulbs, and/or fuses and providing and accurate indication of condition of the tested device to a user thereof.

SUMMARY OF THE INVENTION

The present invention provides an improved combination battery, light bulb, and fuse tester. In particular, the present invention provides a novel battery, light bulb, and fuse tester which is easy to use, especially for elderly individuals, which provides accurate results, and which is inexpensive to produce. According to the invention, the battery tester includes a novel battery testing probe mechanism. Preferably, such a probe mechanism may be comprised of two pincer-like probe arms which may be easily manipulated to clamp a battery, fuse or light bulb to be tested between electrical contacts located therein. More preferably, the probe arms may include a resiliently biased gearing mechanism in order to easily move the probe arms towards and away from one another. The probe arms may be controlled by an actuator, the actuator preferably being a resiliently biased trigger operatively connected thereto.

In a preferred embodiment, the combination battery, light bulb, and fuse tester of the present invention would include a switch so that the tester could be used to measure both large (cylindrical type) or small (button or coin) batteries. Such a switch may be used to so that the testing circuit applies the desired resistive load depending on the battery size. Preferably, the testing circuit is an integrated circuit that may be used to apply the proper load to the battery type selected. The load can be applied for the entire time the battery is connected or it can be timed as is known in the art. Of course, to the extent applicable, the present invention is equally applicable for use with both the load-based and open circuit-type battery testers discussed in detail above.

In a preferred embodiment, a series of transistors may be integrated into the circuit to turn on appropriate LEDs to indicate the condition of the battery. For example, RED, AMBER or GREEN LEDs may be used to indicate "bad", "low", "good" battery conditions depending on what the battery terminal voltage is for a given battery type being tested. In order to produce a highly sensitive tester, a set of potentiometers may be built into the integrated circuit for trimming each tester circuit to the desired cutoff voltage. In such a set-up, a single potentiometer may be used for each LED circuit thereby allowing the load resistance to be set within a range that is closer and more accurate than any range that would be possible without the use of trimmable potentiometers. In this preferred embodiment, the circuits may be tuned or "trimmed" at the factory using sensitive test equipment to desired threshold voltages, and then locked in place using a dab of paint or adhesive. In this way, a high degree of accuracy and repeatability may be calibrated into a preferred embodiment of a battery tester in accordance with the present invention.

In a preferred embodiment, the threshold voltages designed into the tester to trigger the various LED's may be as follows:

| | Tested Battery | RED LED | AMBER LED | GREEN LED |
|---|---|---|---|---|
| 1. | 1.5 V | <1.1 V | $1.1 \leq X < 1.2$ V | $1.2 \leq X$ |
| 2. | 3.0 V | <2.2 V | $2.2 \leq X < 2.3$ V | $2.4 \leq X$ |
| 3. | 9.0 V | <6.6 V | $6.6 \leq X < 7.2$ V | $7.2 \leq X$ |
| 4. | Bulb/Fuse | BAD | Not Applicable | GOOD |

Also in a preferred embodiment, a tester in accordance with the present invention maybe provided with an internal circuit to test the efficacy of the tester's internal batteries for use in applying the desired load. Such a circuit may indicate the low condition of the batteries in many ways. For example, the circuit could be designed to light two LEDs at the same time or to flash the LEDs to indicate to the user that the internal batteries need replacing.

In a further preferred embodiment, the tester of the present invention may include a feature for facilitating the contacting of the battery poles to the electrical contacts on the probe ends. In particular, given that batteries generally have cases made of one type of steel or another, the use of a magnetic electrical contact for one of the probes can facilitate the testing of batteries, especially for those without particularly nimble fingers. This magnetic electrical contact feature makes the invention especially easy to use over prior art battery testers in that the user does not need to carefully place a small battery into a slot, receptacle, or otherwise exhibit excellent eye-hand coordination in order to use the tester. Furthermore, there is little possibility of the battery falling out of the tester once the battery is placed against the magnetic tip.

It is noted that in an embodiment of the present invention including this magnetic contact feature, it may be preferred that only one electrical contact be selectively made from magnetic material. The other electrical contact should be made from a non-magnetic material, thereby preventing the electrical contacts from being held together by a magnetic force which would needlessly make it more difficult to open the probe arms with the handle trigger in order to place a battery, bulb or fuse between the electrical contacts. Of course the use of either one or two electrical contacts having magnetic properties would still be considered within the scope of the invention.

While the battery test circuit used in the present invention need not be any particular battery testing circuit, it is preferred that an electronic load-based battery testing circuit be used. An example of types of electronic battery testing circuits that could be operable in the present invention include the battery testing circuits disclosed in U.S. Pat. Nos. 6,456,045, 5,914,605, 5,376,887, the contents of which are herein incorporated by reference, among others well known in the battery testing art.

Other objects and advantages of the invention maybe apparent to one of ordinary skill in the art upon reference to the drawings, specification and appended claims herein and are considered within the scope of the present invention.

DETAILED DESCRIPTION OF THE INVENTION

Figure 4:
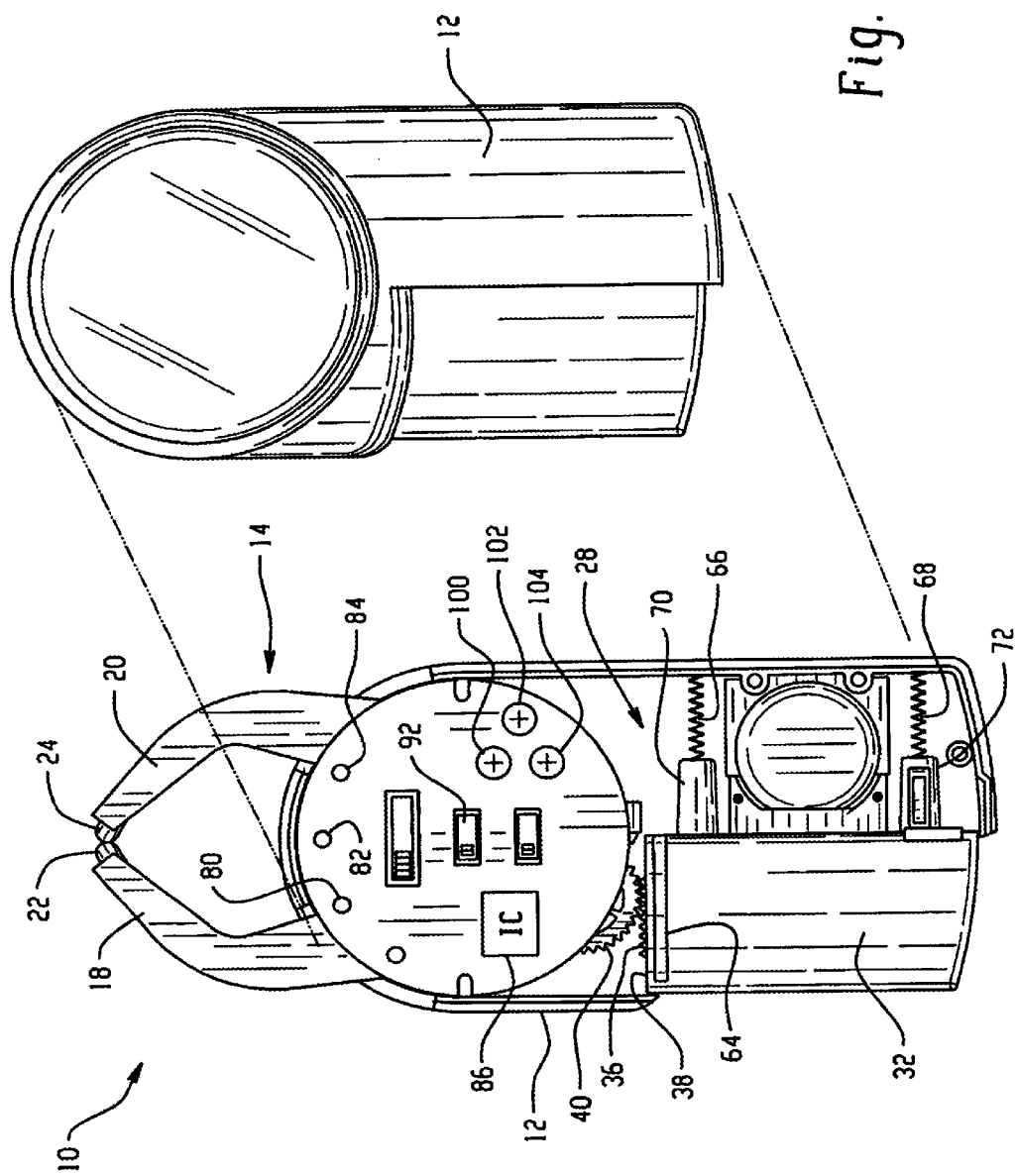
FIG. 4 illustrates an interior view of some of the electronic components for use in accordance with the combination tester of FIG. 1.

The present invention provides a combination battery, light bulb, fuse tester 10. In particular, the present invention provides a novel battery, light bulb, and fuse tester 10 which is easy to use, especially for elderly individuals, which provides accurate results, and which is inexpensive to produce. According to the invention, as best seen in FIG. 4, the battery tester 10 includes a case 12 housing a novel battery testing probe mechanism 14 comprised of two pincer-like probe arms 18, 20 which may be easily manipulated to clamp a battery, fuse or light bulb (not shown) to be tested between electrical contacts 22, 24 located thereon.

Figure 5:
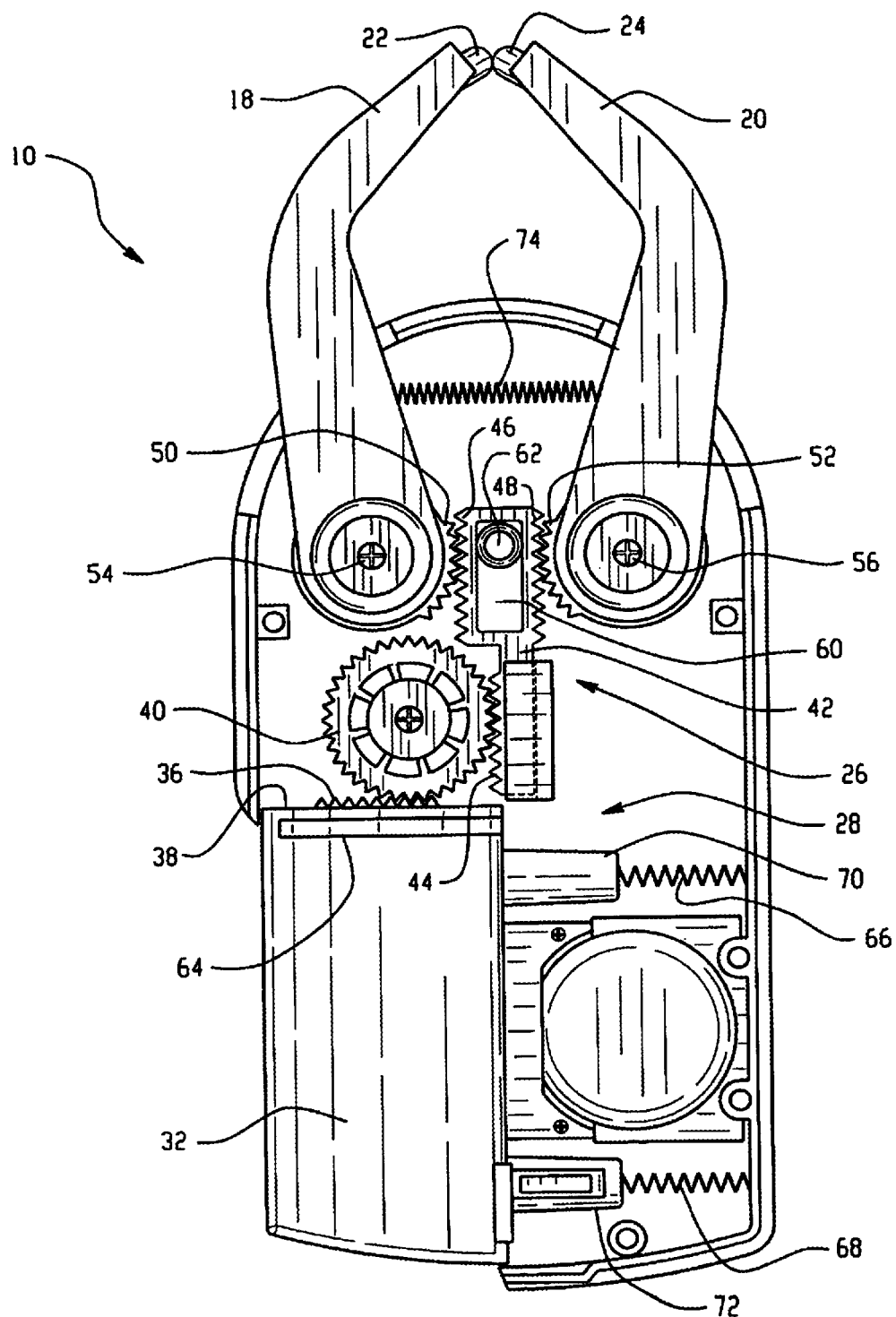
FIG. 5 illustrates a detail view of the probe arm mechanism for use in accordance with the combination tester of FIG. 1 in a closed position.
Figure 6:
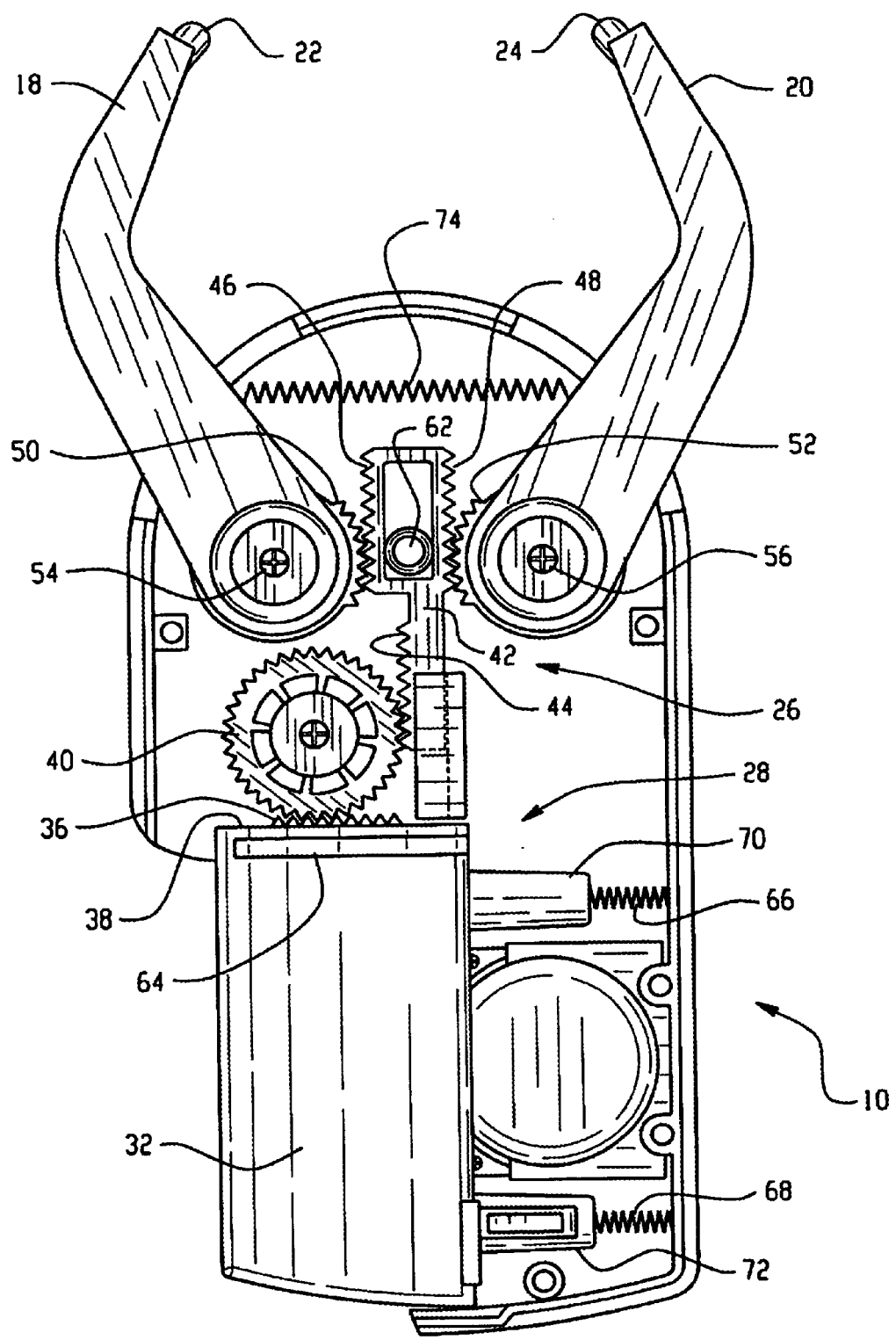
FIG. 6 illustrates a detail view of the probe arm mechanism for use in accordance with the combination tester of FIG. 5 in an open position.

Preferably, as best seen in FIGS. 5 and 6, the probe arms 18, 20 include a resiliently biased gearing mechanism 26 in order to easily move the probe arms 18, 20 towards and away from one another. The probe arms 18, 20 are controlled by an actuator 28, the actuator 28 preferably including a resiliently biased trigger 32 operatively connected thereto.

More preferably, the resiliently biased gearing mechanism 26 comprises a resiliently biased trigger 32 having a first rack 36 positioned on an upper surface 38 thereof, a pinion gear 40, a second rack 42, including a set of lower teeth 44 and oppositely opposed sets of upper gear teeth 46, 48. Additionally, in such embodiment, the probe arms 18, 20 each include a set of gear teeth 50, 52 molded on the lower portion of each. The probe arms 18,20 also preferably include pivot axles 54, 56 to hold the probe arms 18, 20 in a fixed, pivotable arrangement. Additionally, in this embodiment, it is preferable that the second rack 42 preferably include an anchoring member, which, in particular, may be comprised of a slot 60 positioned between the oppositely opposed sets of upper teeth 46, 48 for slidably receiving an anchoring post 62 molded or attached to the tester 10 case 12.

In the preferred gearing mechanism 26 disclosed herein, the gearing members are preferably arranged such that the first rack 36 engages the pinion 40, the pinion 40 engages the lower teeth 44 of the second rack 42, and the upper teeth 46, 48 of the second rack engage the gear teeth 50, 52 molded on the lower portion of the probe arms 18, 20. Additionally, it is preferred that the trigger 32 of the actuator 28 include a slot 64 formed in both the upper and undersides of the trigger 32 to slidably receive associated ribs (not shown) formed in the upper and undersides of the case 12. Finally, in a preferred embodiment, resilient biasing members are used to bias the probe arms 18,20 to a normally closed position. Such biasing members may be provided in many ways, one way being the way shown best in FIG. 5. In particular, at least one helical spring 66, and preferably a second 68, may be provided and seated in associated cylindrical seats 70, 72 formed in the trigger 32. The helical springs 66, 68 are selected so that they bias the trigger 32 to an outward position by pressing against the inside of the case 12 when the trigger 32 is depressed. An additional biasing force may be provided by a helical spring 74 which is provided to attach between the probe arms 18, 20. The helical spring 74 is chosen so that it biases the probe arms 18, 20 towards each other.

In the embodiment disclosed above, the actuation of the probe arms 18, 20 may be accomplished as follows. The user of the tester 10 depresses the trigger 32 inwardly. The movement of the trigger 32 causes the first rack 36 to move laterally, thereby causing the pinion 40 to rotate accordingly. The movement of the pinion 40 forces the second rack 42 to move vertically upward about the anchoring post 62. This movement then causes the upper gear teeth 46, 48 to mesh with the probe arms 18, 20 respective gear teeth 50, 52, thereby causing the upper portions of the probe arms 18, 20 to rotate away from each other about their respective pivot axles 54, 56. Releasing of the trigger 32 causes the probe arms 18, 20 to return to the normally-closed position due to the biasing forces provided by helical springs 66, 68, and helical spring 74. Of course, it should be noted that there are many additional mechanisms that may be used to rotate, or even translate, the probe arms of the present invention away from each other such that may clamp a battery, light bulb, or fuse therebetween to test. While these methods and mechanisms are not specifically disclosed herein, there use and incorporation in accordance with the invention would be considered within the scope of one of ordinary skill in the mechanical arts, and, as such, would be considered within the scope of the invention.

In a preferred embodiment, the tester 10 of the present invention includes several user-friendly features. For example, as discussed above, the probe arms 18, 20 preferably include at least one electrical contact 22 that may be made of a magnetic material to help hold a battery, fuse or light bulb (not shown) being tested between the electrical contacts 22,24. The magnetic electrical contact may be made of any suitable magnetic material, but is preferably made from a "permanent" magnetic material, and more preferably may be made of neodium. Neodium is a material known for exhibiting relatively high Gauss magnetic properties and is thus well suited to this application. A relatively small size magnetic electrical contact 22 can be made that is capable to holding a small button or coin battery in place against the electrical contact 22 of the tester.

Also in a preferred embodiment, electrical contact 24 may be preferably made from a non-magnetic material, such as copper. Copper is preferable because not only is it considered a "non-magnetic", but is naturally of a different color than, neodium, as used in a preferred embodiment in the magnetic electrical contact 22. This is preferred in that it can be used to aid in differentiating the "+" and "−" electrical contacts. As a further aid to differentiation, the magnetic neodium electrical contact may be zinc plated to help distinguish it from the copper "−" electrical contact.

In another preferred embodiment of the present invention, the tester 10 preferably includes LED indicator lights 80, 82, 84 to indicate the status of the battery, light bulb or fuse being tested. In a preferred embodiment, there are three LED's employed in the first embodiment of the invention to show that a battery is "Good", "Low", or "Bad" and these LED's may be green, amber and red, respectively. Of course, it would be feasible within the scope of the invention to provide more LED's that could show a range of, for example, "Bad", "10%–20%", "20%–50%", "50%–80%", "80%–100%" . . . or some other set of ranges. Additionally, it would be within the scope of the invention to provide a meter to reflect the level of battery condition.

Also, as discussed above, it is preferred that an electronic load-based battery testing circuit 86 be used in accordance with the invention. Also as discussed above, a conductivity circuit should be added for the embodiments of the invention which have a light bulb or fuse testing feature.

Figure 1:
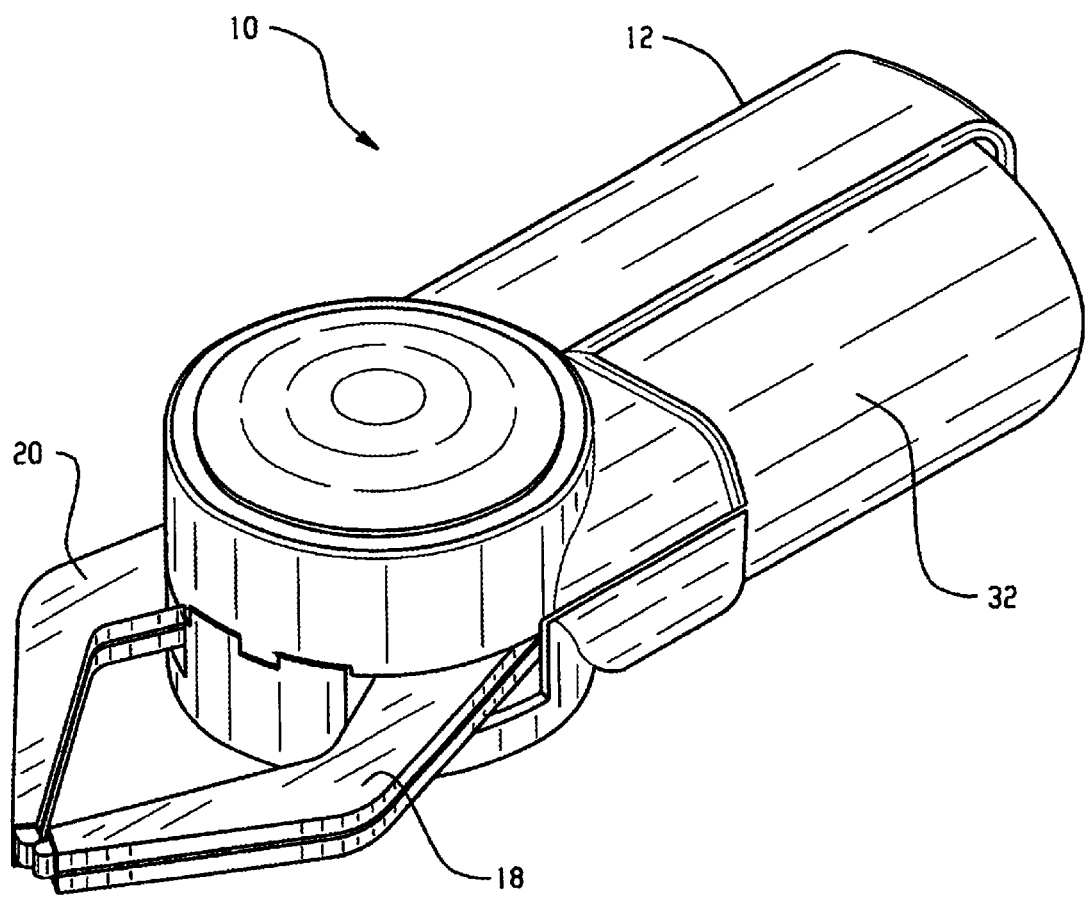
FIG. 1 illustrates a front perspective view of one embodiment of a combination battery, light bulb, fuse tester in accordance with the present invention.
Figure 2:
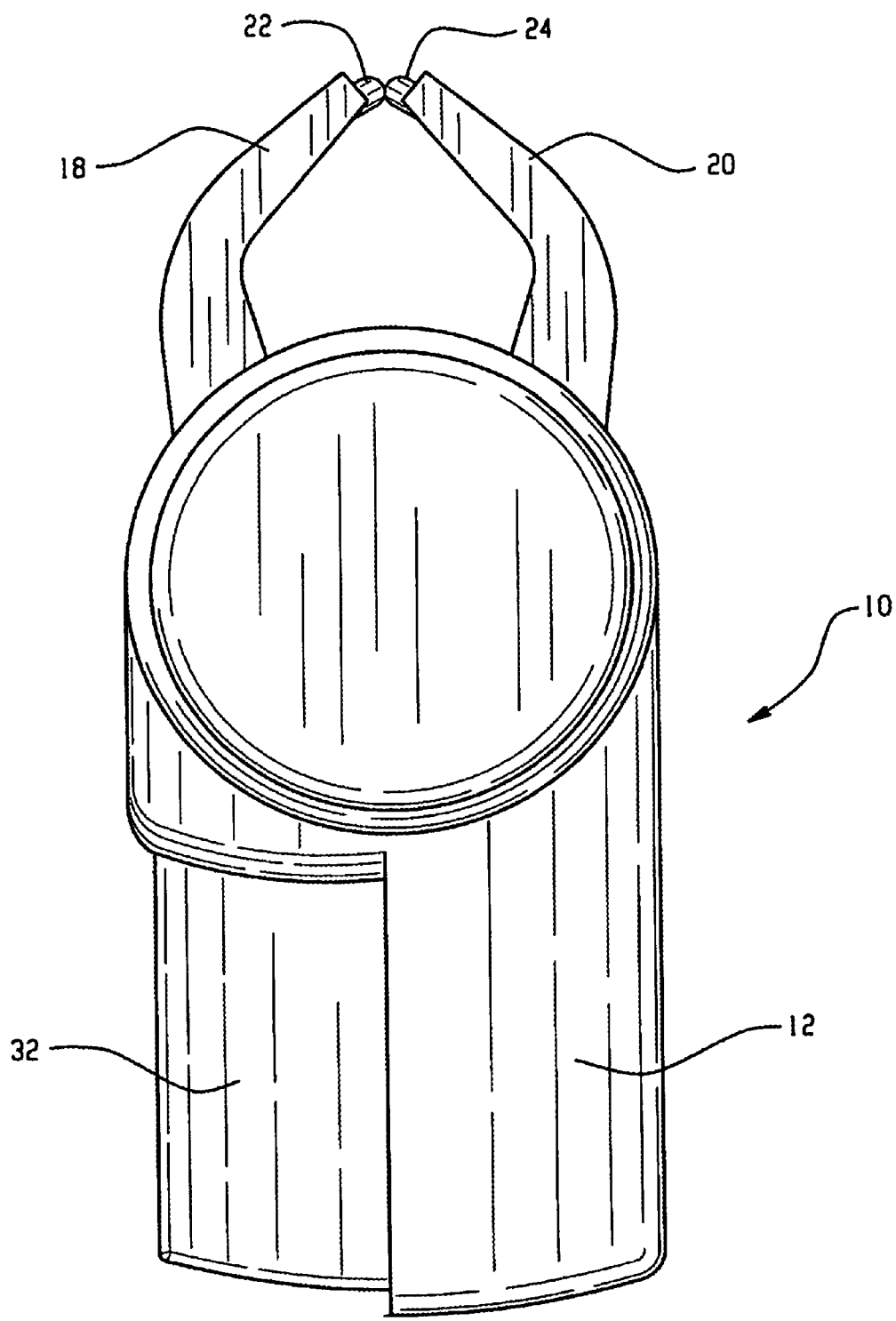
FIG. 2 illustrates a top plan view of the combination tester of FIG. 1.
Figure 3:
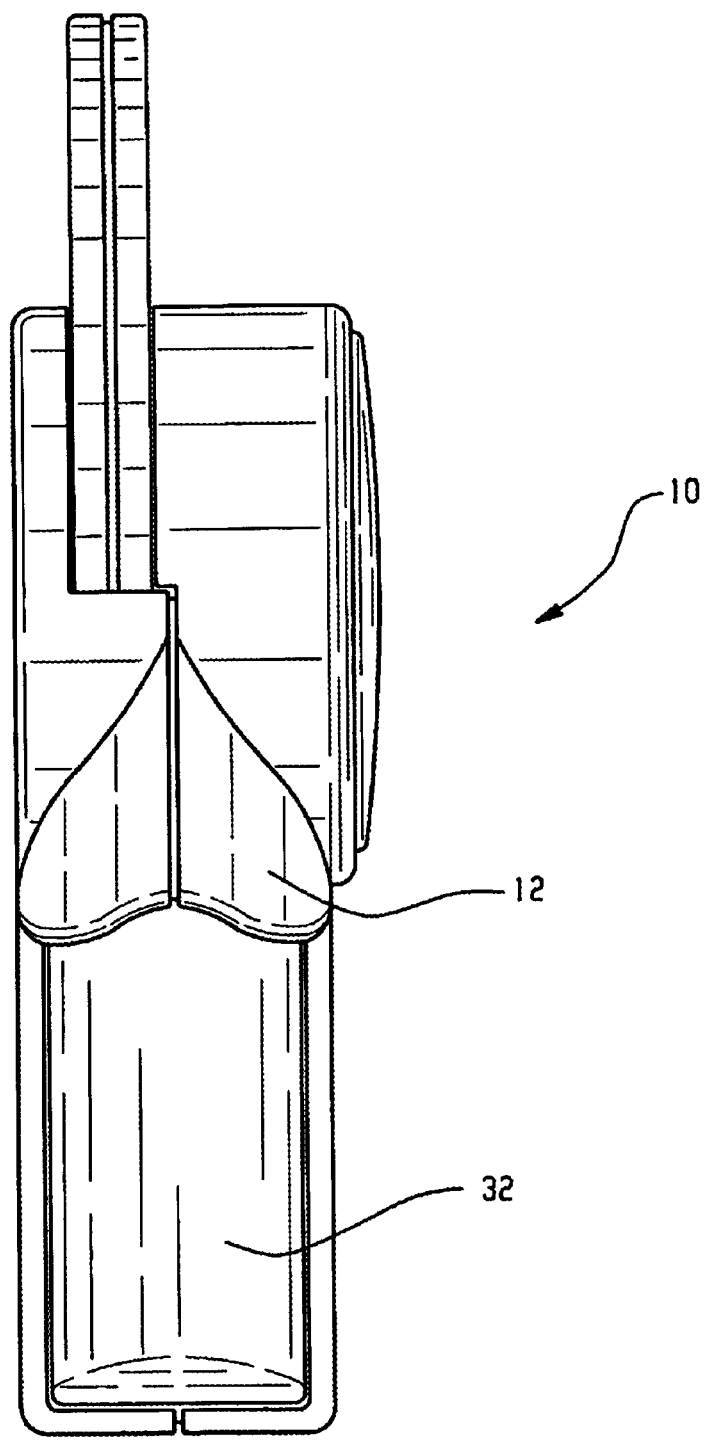
FIG. 3 illustrates a side elevation view of the combination tester of FIG. 1.

In operation, the electrical contacts 22, 24 are designed to allow a variety of batteries, bulbs and fuses to be trapped between the "+" and "−" tester tips in a user-friendly manner. The contacts 22, 24 preferably are formed in a round shape to allow contact to be made with the corresponding terminals or contacts of batteries, bulbs and fuses no matter how close or far apart the probe arms 18,20, and thus the electrical contacts 22, 24 on the tips thereof, are separated. As shown in FIGS. 1 and 2, in the normally closed position, the electrical contacts 22, 24 of the tester 10 may be touching.

In other preferred embodiments, a switch 92 may be provided to select between cylindrical and button-type batteries.. Also, potentiometers 100, 102, 104, which may correspond to the "good", "low", or "bad" LED indicator lights, may be provided so that the battery testing circuit may be trimmed during manufacture to insure the accuracy of the tester 10.

What is claimed is:

1. Battery contacting probe apparatus for use in a battery tester comprising:
   an actuator;
   a pair of opposed probe arms, each of said probe arms having an electrical contact on an end thereof;
   said actuator operatively connected to said probe arms wherein movement of said actuator biases said ends of said probe arms away from each other to an open position allowing the electrical poles of a battery to be tested to be contacted by said contacts on said probe arms and wherein said actuator comprises a rack and pinion gear system.

2. The probe apparatus of claim 1 wherein said rack and pinion gear system comprises:
   a resiliently biased trigger having a first rack positioned on an upper surface thereof;
   a pinion gear;
   a second rack including a set of lower teeth and oppositely opposed sets of upper teeth;
   gear teeth molded on the lower portion of said probe arms;
   wherein said first rack engages said pinion, said pinion engages said lower teeth of said second rack, and said upper teeth of said second rack engage said gear teeth molded on the lower portion of said probe arms.

3. The probe apparatus of claim 2 wherein said resiliently biased trigger is biased by at least one spring.

4. The probe apparatus of claim 3 wherein said trigger includes a slot formed therein for slidably receiving an associated rib.

5. The probe apparatus of claim 2 wherein said second rack includes a slot positioned between said oppositely opposed sets of upper teeth for slidably receiving an anchoring post.

6. The probe apparatus of claim 1 wherein said pair of probe arms include a spring attached to a lower portion thereof resiliently biasing said probe arms to a normally closed position.

7. The probe apparatus of claim 1 wherein one of said electrical contacts is made of a magnetic material to facilitate the engagement of said electrical contact with said poles of a battery.

8. The probe apparatus of claim 7 wherein the other of said electrical contacts is made from a generally non-magnetic material.

9. The probe apparatus of claim 8 wherein said non-magnetic material is copper.

10. The probe apparatus of claim 7 wherein said magnetic material is neodium.

11. The probe apparatus of claim 1 wherein said probe arms are adapted for contacting the poles of a fuse or a light bulb for measuring the efficacy thereof.

12. A battery tester comprising:
    a case;
    a battery testing circuit;
    an actuator;
    a pair of opposed probe arms, each of said probe arms having an electrical contact and being pivotally mounted to said case and being biased to a closed position; and
    a spring biasing means biasing said opposed probe arms to said closed position;
    said battery testing circuit being operatively connected to said electrical contacts;
    wherein said actuator is operatively connected to said probe arms wherein operation of said actuator moves said contacts away from each other to an open position allowing the electrical poles of a battery to be tested to be contacted by said contacts on said probe arms such that said battery testing circuit can measure the efficacy of said battery.

13. The battery tester of claim 12 wherein said actuator comprises:
    a rack and pinion gear system.

14. The battery tester of claim 13 wherein said rack and pinion gear system comprises:
    a resiliently biased trigger having a first rack positioned on an upper surface thereof;
    a pinion gear;
    a second rack including a set of lower teeth and oppositely opposed sets of upper teeth;
    gear teeth molded on the lower portion of said probe arms;
    wherein said first rack engages said pinion, said pinion engages said lower teeth of said second rack, and said upper teeth of said second rack engage said gear teeth molded on the lower portion of said probe arms.

15. The battery tester of claim 14 wherein said resiliently biased trigger is biased by at least one spring.

16. The battery tester of claim 15 wherein said trigger includes a slot formed therein for slidably receiving an associated rib.

17. The battery tester of claim 14 wherein said second rack includes a slot positioned between said oppositely opposed sets of upper teeth for slidably receiving an anchoring post.

18. The battery tester of claim 12 wherein said spring means includes a spring attached to a lower portion of each probe arms resiliently biasing said probe arms to said closed position.

19. The battery tester of claim 12 wherein one of said electrical contacts is made of a magnetic material to facilitate the engagement of said electrical contact with one of said poles of a battery.

20. The battery tester of claim 19 wherein the other of said electrical contacts is made from a generally non-magnetic material.

21. The battery tester of claim 19 wherein said magnetic material is neodium.

22. The battery tester of claim 12 wherein said probe arms are adapted for contacting the poles of a fuse or a light bulb for measuring the efficacy thereof and further comprising a conductivity circuit adapted for the same.

23. The battery tester of claim 12 wherein said battery testing circuit includes potentiometers which may trimmed to a desired setting.

24. The battery tester of claim 12 wherein said battery testing circuit is load-based.

25. The battery tester of claim 12 further comprising red, amber and green LED indicators operatively connected to said battery testing circuit for indicating the bad, low, and good status, respectively, of a tested battery.

26. The battery tester of claim 12 further comprising a light for illuminating a face of an associated battery tester case.

27. The battery tester of claim 12 wherein said probe arms are in direct contact with each other in said closed position.

28. A tester for a battery comprising a pair of electrical contacts for contacting a battery to be tested wherein at least one of said electrical contacts is comprised of a permanent magnetic material of sufficient magnetic strength to hold a battery thereagainst and configured to pass a current supplied from said battery to be tested therethrough, and wherein at least one of said electrical contacts is movable closer to or further away from the other electrical contact to allow differently sized and different types of batteries to be received therebetween.

29. The tester of claim 28 further comprising a case, and wherein each contact is coupled to and movable relative to said case.

30. The tester of claim 29 wherein each contact is pivotally mounted to said case.

31. The tester of claim 30 wherein said contacts are spring biased to a closed position.

32. The tester of claim 28 wherein only one of said electrical contacts is comprised of a permanent magnetic material.

33. The tester of claim 28 wherein said pennanent magnetic material is neodium.

34. A battery, bulb or fuse testing apparatus comprising:
a case;
a pair of movable opposed probe arms coupled to said case, each probe arm having an electrical contact;
a movable actuator fixedly and generally non-removably coupled to at least one of said case or at least one of said pair of movable arms, wherein operation of said actuator causes both of said probe arms to move away from each other an relative to said case to receive a battery, bulb or a fuse therebetween; and
a circuit electrically coupled to said electrical contacts, wherein said probe arms, electrical contacts and circuit are arranged such that during operation a current is passed to one probe arm, from said one probe arm through a battery, intact bulb or intact fuse located between said probe arms and that is in electrical contact with said electrical contacts and from said battery, intact bulb or intact fuse to the other one of said probe arms.

35. The battery, bulb or fuse testing apparatus of claim 34 wherein said actuator is indirectly operatively coupled to said movable opposed probe arms to cause said probe arms to move away from each other upon movement of said actuator.

36. The battery, bulb or fuse testing apparatus of claim 34 wherein said actuator is movable in a first manner and said probe arms are movable in second manner.

37. The battery, bulb or fuse testing apparatus of claim 36 wherein said first manner is linear movement and said second manner is rotational movement.

38. The battery, bulb or fuse testing apparatus of claim 34 wherein said probe arms are biased into a closed position wherein said probe arms are in direct contact with each other.

39. The battery, bulb or fuse testing apparatus of claim 34 wherein at least one of said electrical contacts is made of a magnetic material.

40. The battery, bulb or fuse testing apparatus of claim 34 wherein each electrical contact is located at a distal end of the associated probe arm.

41. The battery, bulb or fuse testing apparatus of claim 34 wherein each of said arms is movable away from the other one of said arms.

42. The battery, bulb or fuse testing apparatus of claim 34 wherein said apparatus lacks any other probe arms having an electrical contact for contacting a battery, bulb or fuse.

43. The battery, bulb or fuse testing apparatus of claim 34 further comprising output means to provide output relating to an electrical characteristic of a battery, bulb or fuse tested by said apparatus.

44. The battery, bulb or fuse testing apparatus of claim 34 wherein probe arms are configured to be located on differing contacts of a battery, bulb, or fuse such that during operation a current is passed from one probe arm through said battery, intact bulb or intact fuse and from said battery, intact bulb or intact fuse to the other one of said probe arms via said circuit.

45. The battery, bulb or fuse testing apparatus of claim 44 wherein said circuit is configured to determine an electrical characteristic of a battery, bulb or fuse based upon said current passed through said probe arms and said circuit such that an electrical current is passed from one arm to the other arm via said circuit.

46. The battery, bulb or fuse testing apparatus of claim 34 further comprising a battery, bulb or fuse located between and in electrical contact with said probe arms, said battery bulb or fuse having two terminals, each terminal being directly electrically coupled to one of said probe arms.

47. The testing apparatus of claim 34 wherein each probe arm is pivotally mounted to said case.

48. A battery, bulb or fuse testing apparatus comprising:
a pair of movable opposed probe arms, each probe arm having an electrical contact;
an movable actuator, wherein movement of said actuator in a linear manner causes said probe arms to move away from each other in a rotational manner such that said probe arms can receive a battery, bulb or a fuse therebetween; and
a circuit electrically coupled to said electrical contacts to pass a current through a battery, bulb or fuse located between said probe arms and that is in electrical contact with said electrical contacts.

49. A battery, bulb or fuse testing apparatus comprising:
a pair of opposed probes, each probe having an electrical contact wherein at least one of said electrical contacts is made of a magnetic material;
an actuator configured such that operation of said actuator causes relative movement between said probes such that said probes can receive a battery, bulb or a fuse therebetween; and
a circuit electrically coupled to said electrical contacts to pass a current through a battery, bulb or fuse located between said probes and that is in electrical contact with said electrical contacts or to receive a current therethrough as supplied by said battery, bulb or fuse located between said probes.

50. The testing apparatus of claim 49 wherein only one of said electrical contacts is made of a magnetic material.

51. The testing apparatus of claim 49 wherein said magnetic material is neodium.

52. A battery, bulb or fuse testing apparatus comprising:
a case;
a pair of opposed probe arms pivotally coupled to said case, each probe arm having an electrical contact;
an actuator fixedly and generally non-removably coupled to at least one of said case or at least one of said pair of movable arms, wherein operation of said actuator causes said probe arms to pivotally move away from each other to receive a battery, bulb or a fuse therebetween; and
a test circuit electrically coupled to said electrical contacts, wherein said contacts, said probe arms and circuit are arranged to pass a current from a battery, bulb or fuse located between said probe arms to one of said probe arms, from said one of said probe arms to said test circuit, and from said test circuit to the other one of said probe arms.

* * * * *

UNITED STATES PATENT AND TRADEMARK OFFICE
CERTIFICATE OF CORRECTION

PATENT NO. : 7,049,822 B2
APPLICATION NO. : 10/284755
DATED : May 23, 2006
INVENTOR(S) : Chi Hung Kung It is certified that error appears in the above-identified patent and that said Letters Patent is hereby corrected as shown below:

Column 6, line 22, change "neodium. Neodium" to --neodymium. Neodymium--

Column 6, line 33, change "neodium," to --neodymium,--

Column 6, line 36, change "neodium" to --neodymium--

Column 7, line 56, change "neodium" to --neodymium--

Column 8, line 48, change "neodium" to --neodymium--

Column 9, line 18, change "pennanent" to --permanent--

Column 9, line 19, change "neodium" to --neodymium--

Column 10, line 48, change "neodium" to" to --neodymium--

Signed and Sealed this

Sixth Day of March, 2007

JON W. DUDAS
*Director of the United States Patent and Trademark Office*